US009236342B2

(12) United States Patent
Bristol et al.

(10) Patent No.: US 9,236,342 B2
(45) Date of Patent: Jan. 12, 2016

(54) SELF-ALIGNED VIA AND PLUG PATTERNING WITH PHOTOBUCKETS FOR BACK END OF LINE (BEOL) INTERCONNECTS

(71) Applicants: Robert L. Bristol, Portland, OR (US); Kevin Lin, Chandler, AZ (US); Kanwal Jit Singh, Hillsboro, OR (US); Alan M. Myers, Beaverton, OR (US); Richard E. Schenker, Portland, OR (US)

(72) Inventors: Robert L. Bristol, Portland, OR (US); Kevin Lin, Chandler, AZ (US); Kanwal Jit Singh, Hillsboro, OR (US); Alan M. Myers, Beaverton, OR (US); Richard E. Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 14/133,385

(22) Filed: Dec. 18, 2013

(65) Prior Publication Data

US 2015/0171010 A1    Jun. 18, 2015

(51) Int. Cl.
| | |
|---|---|
| *H01L 21/311* | (2006.01) |
| *H01L 23/522* | (2006.01) |
| *H01L 21/768* | (2006.01) |
| *H01L 21/027* | (2006.01) |
| *H01L 23/532* | (2006.01) |

(52) U.S. Cl.
CPC ........ *H01L 23/5226* (2013.01); *H01L 21/0274* (2013.01); *H01L 21/31111* (2013.01); *H01L 21/76802* (2013.01); *H01L 21/76897* (2013.01); *H01L 23/522* (2013.01); *H01L 23/5329* (2013.01); *H01L 2924/0002* (2013.01)

(58) Field of Classification Search
CPC ..................... H01L 21/0228; H01L 21/28194; H01L 21/3141; H01L 21/32139; H01L 21/02672; H01L 21/76224; H01L 21/02107; H01L 21/76205

USPC ......... 438/700, 637, 270, 308, 672, 786, 680, 438/787; 257/E21.006, E21.023, E21.027, 257/E21.058, E21.17, E21.231, E21.267, 257/E21.278, E21.328, E21.347, E21.545, 257/E21.547, E21.564, E21.577
See application file for complete search history.

(56) References Cited

U.S. PATENT DOCUMENTS

| | | | | |
|---|---|---|---|---|
| 7,459,792 | B2 * | 12/2008 | Chen .............................. | 257/774 |
| 7,700,466 | B2 * | 4/2010 | Booth et al. .................. | 438/517 |
| 8,267,583 | B2 * | 9/2012 | Yao et al. ........................ | 384/31 |
| 8,395,224 | B2 * | 3/2013 | Becker et al. ................. | 257/401 |
| 8,508,008 | B2 * | 8/2013 | Griebenow et al. ........... | 257/431 |
| 8,863,063 | B2 * | 10/2014 | Becker et al. ................. | 716/118 |

\* cited by examiner

*Primary Examiner* — David Nhu

(74) *Attorney, Agent, or Firm* — Blakely, Sokoloff, Taylor & Zafman LLP

(57) ABSTRACT

Self-aligned via and plug patterning with photobuckets for back end of line (BEOL) interconnects is described. In an example, an interconnect structure for an integrated circuit includes a first layer of the interconnect structure disposed above a substrate, the first layer having a first grating of alternating metal lines and dielectric lines in a first direction. The dielectric lines have an uppermost surface higher than an uppermost surface of the metal lines. The integrated circuit also includes a second layer of the interconnect structure disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. The integrated circuit also includes a region of dielectric material disposed between the metal lines of the first grating and the metal lines of the second grating, and in a same plane as upper portions of the dielectric lines of the first grating and lower portions of the dielectric lines of the second grating. The region of dielectric material is composed of a cross-linked photolyzable material.

20 Claims, 17 Drawing Sheets

SELF-ALIGNED VIA AND PLUG PATTERNING WITH PHOTOBUCKETS FOR BACK END OF LINE (BEOL) INTERCONNECTS

TECHNICAL FIELD

Embodiments of the invention are in the field of semiconductor structures and processing and, in particular, self-aligned via and plug patterning with photobuckets for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1A illustrates a cross-sectional view of a starting structure following deposition, but prior to patterning, of a hardmask material layer formed on an interlayer dielectric (ILD) layer;

FIG. 1B illustrates the structure of FIG. 1A following patterning of the hardmask layer by pitch doubling;

FIG. 1C illustrates the structure of FIG. 1B following formation of a second patterned hardmask;

FIG. 1D illustrates the structure of FIG. 1C following deposition of a hardmask cap layer;

FIG. 1E illustrates the structure of FIG. 1D following patterning of the hardmask cap layer;

FIG. 1F illustrates the structure of FIG. 1E following further patterning of the first patterned hardmask and subsequent formation of a plurality of photobuckets;

FIG. 1G illustrates the structure of FIG. 1F following photobucket exposure and development to leave selected via locations, and subsequent via opening etch into the underlying ILD;

FIG. 1H illustrates the structure of FIG. 1G following removal of the remaining photobuckets, subsequent formation of a hardmask material, and subsequent formation of a second plurality of photobuckets;

FIG. 1I illustrates the structure of FIG. 1H following plug location selection;

FIG. 1J illustrates the structure of FIG. 1I following removal of the most recently formed hardmask from via and line locations;

FIG. 1K illustrates the structure of FIG. 1J following recessing of the patterned ILD layer in locations not protected by plug-forming photobuckets; and FIG. 1L illustrates the structure of FIG. 1K following metal fill.

FIG. 2A illustrates a plan view and corresponding cross-sectional views of a starting orthogonal grid formed above a substrate;

FIG. 2B illustrates a plan view and corresponding cross-sectional views of the structure of FIG. 2A following opening fill and etch back of a dielectric layer;

FIG. 2C illustrates a plan view and corresponding cross-sectional views of the structure of FIG. 2B following photo-bucket fill, exposure, and development to leave selected plug locations;

FIG. 2D illustrates a plan view and corresponding cross-sectional views of the structure of FIG. 2C following removal of portions of the dielectric layer of FIG. 2B;

FIG. 2E illustrates a plan view and corresponding cross-sectional views of the structure of FIG. 2D following photo-bucket fill, exposure, and development to leave selected via locations;

FIG. 2F illustrates a plan view and corresponding cross-sectional views of the structure of FIG. 2E following via opening etch into the underlying ILD; and FIG. 2G illustrates a plan view and corresponding cross-sectional views of the structure of FIG. 2F following removal of the second hardmask layer and the remaining photobucket material.

FIG. 3A illustrates a starting point structure for a subtractive via and plug process following deep metal line fabrication;

FIG. 3B illustrates the structure of FIG. 3A following recessing of the metal lines;

FIG. 3C illustrates the structure of FIG. 3B following formation of an inter layer dielectric (ILD) layer;

FIG. 3D illustrates the structure of FIG. 3C following deposition and patterning of a hardmask layer;

FIG. 3E illustrates the structure of FIG. 3D following trench formation defined using the pattern of the hardmask of FIG. 3D;

FIG. 3F illustrates the structure of FIG. 3E following photobucket formation in all possible via locations;

FIG. 3G illustrates the structure of FIG. 3F following via location selection;

FIG. 3H illustrates the structure of FIG. 3G following conversion of the remaining photobuckets to permanent ILD material; and FIG. 3I illustrates the structure of FIG. 3H following metal line and via formation.

DESCRIPTION OF THE EMBODIMENTS

Figure 1A:
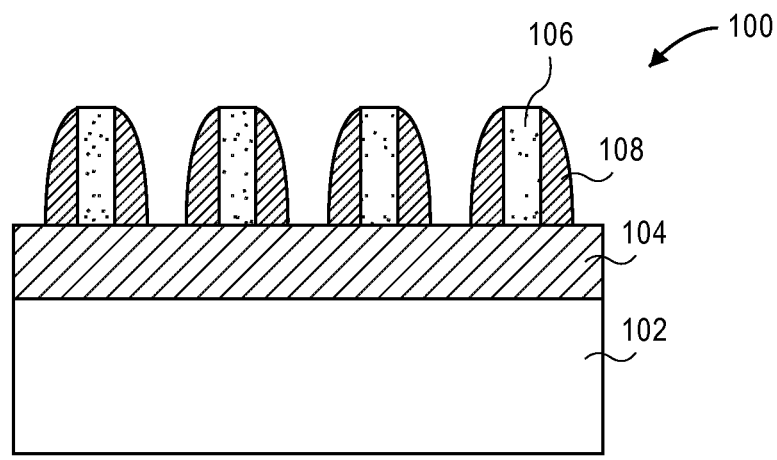
FIGS. 1A-1L illustrate portions of integrated circuit layers representing various operations in a method of subtractive self-aligned via and plug patterning, in accordance with an embodiment of the present invention, where.

Self-aligned via and plug patterning with photobuckets for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to subtractive approaches for self-aligned via and plug patterning, and structure resulting there from. In an embodiment, processes described herein enable realization of self-aligned metallization for back-end of line feature fabrication. Overlay problems anticipated for next generation via and plug patterning may be addressed by one or more approaches described herein.

To provide context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In general, one or more embodiments are directed to an approach that employs a subtractive technique to form conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

More specifically, one or more embodiment described herein involves the use of a subtractive method to pre-form every via and plug using the trenches already etched. An additional operation is then used to select which of the vias and plugs to retain. Such operations can be illustrated using "photobuckets," although the selection process may also be performed using a more conventional resist expose and ILD backfill approach.

In a first aspect, a vias first, plugs second approach is used. As an example, FIGS. 1A-1L illustrate portions of integrated circuit layers representing various operations in a method of subtractive self-aligned via and plug patterning, in accordance with an embodiment of the present invention. In each illustration at each described operation, cross-sectional and/or angled views are shown. These views will be referred to herein as corresponding cross-sectional views and angled views.

FIG. 1A illustrates a cross-sectional view of a starting structure 100 following deposition, but prior to patterning, of a first hardmask material layer 104 formed on an interlayer dielectric (ILD) layer 102, in accordance with an embodiment of the present invention. Referring to FIG. 1A, a patterned mask 106 has spacers 108 formed along sidewalls thereof, on or above the first hardmask material layer 104.

Figure 1B:
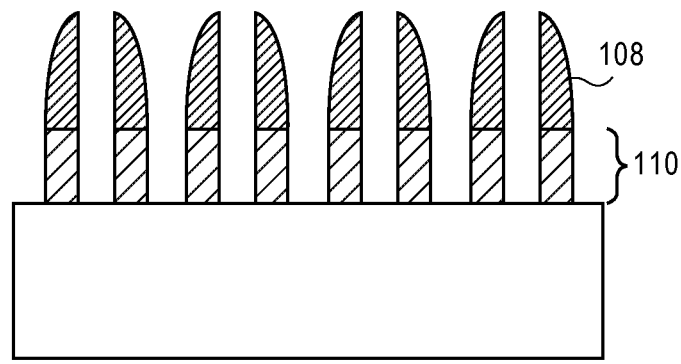

FIG. 1B illustrates the structure of FIG. 1A following patterning of the first hardmask layer by pitch doubling, in accordance with an embodiment of the present invention. Referring to FIG. 1B, the patterned mask 106 is removed and the resulting pattern of the spacers 108 is transferred, e.g., by an etch process, to the first hardmask material layer 104 to form a first patterned hardmask 110. In one such embodiment, the first patterned hardmask 110 is formed with a grating pattern, as is depicted in FIG. 1B. In an embodiment, the grating structure of the first patterned hardmask 110 is a tight pitch grating structure. In a specific such embodiment, the tight pitch is not achievable directly through conventional lithography. For example, a pattern based on conventional lithography may first be formed (mask 106), but the pitch may be halved by the use of spacer mask patterning, as is depicted in FIGS. 1A and 1B. Even further, although not shown, the original pitch may be quartered by a second round of spacer mask patterning. Accordingly, the grating-like pattern of the first patterned hardmask 110 of FIG. 1B may have hardmask lines spaced at a constant pitch and having a constant width.

Figure 1C:
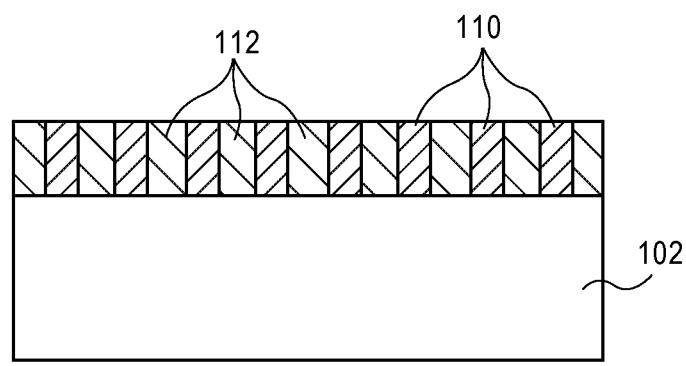

FIG. 1C illustrates the structure of FIG. 1B following formation of a second patterned hardmask, in accordance with an embodiment of the present invention. Referring to FIG. 1C, a second patterned hardmask 112 is formed interleaved with the first patterned hardmask 110. In one such embodiment, the second patterned hardmask 112 is formed by deposition of a second hardmask material layer (having a composition different from the first hardmask material layer 104. The second hardmask material layer is then planarzied, e.g., by chemical mechanical polishing (CMP), to provide the second patterned hardmask 112.

Figure 1D:
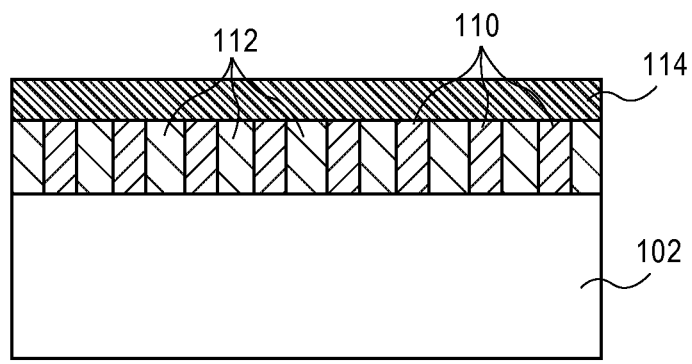

FIG. 1D illustrates the structure of FIG. 1C following deposition of a hardmask cap layer, in accordance with an embodiment of the present invention. Referring to FIG. 1D, a hardmask cap layer 114 is formed on the first patterned hardmask 110 and the second patterned hardmask 112. In one such embodiment, the material composition and etch selectivity of the hardmask cap layer 114 is different as compared to the first patterned hardmask 110 and the second patterned hardmask 112.

Figure 1E:
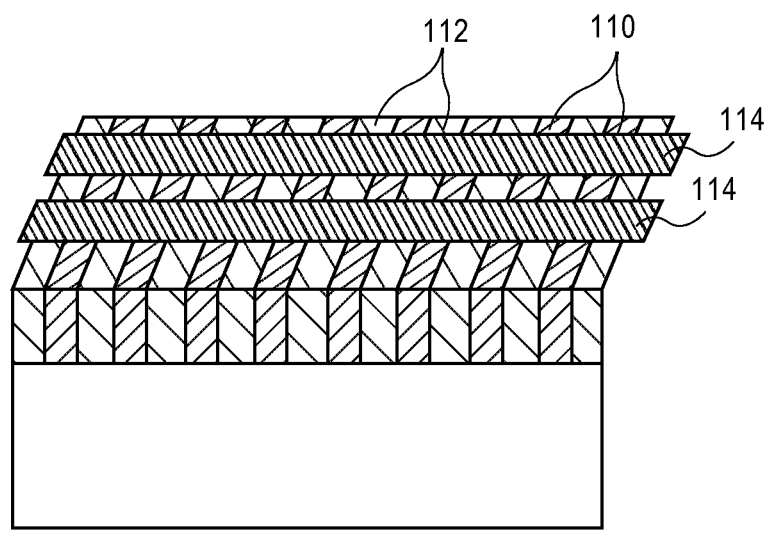

FIG. 1E illustrates the structure of FIG. 1D following patterning of the hardmask cap layer, in accordance with an embodiment of the present invention. Referring to FIG. 1E, a patterned hardmask cap layer 114 is formed on the first patterned hardmask 110 and the second patterned hardmask 112. In one such embodiment, the patterned hardmask cap layer 114 is formed with a grating pattern orthogonal to the grating pattern of the first patterned hardmask 110 and the second patterned hardmask 112, as is depicted in FIG. 1E. In an embodiment, the grating structure formed by the patterned hardmask cap layer 114 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the patterned hardmask cap layer 114 of FIG. 1E may have hardmask lines spaced at a constant pitch and having a constant width.

Figure 1F:
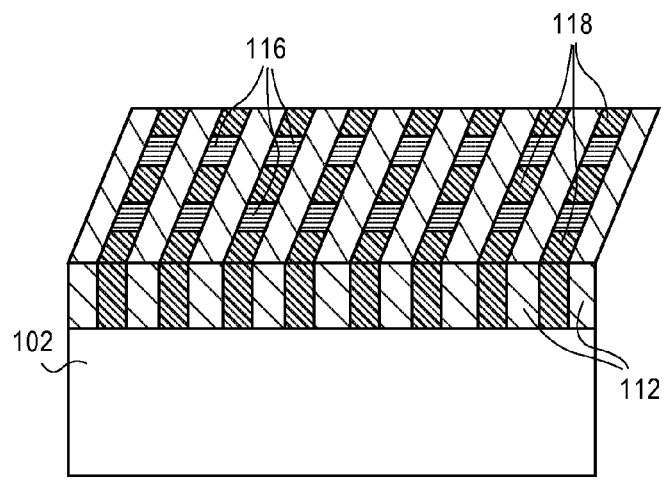

FIG. 1F illustrates the structure of FIG. 1E following further patterning of the first patterned hardmask and subsequent formation of a plurality of photobuckets, in accordance with an embodiment of the present invention. Referring to FIG. 1F, using the patterned hardmask cap layer 114 as a mask, the first patterned hardmask 110 if further patterned to form photobuckets 116. The second patterned hardmask 112 is not further patterned in this process. Subsequently, the patterned hardmask cap layer 114 is removed, and photobuckets 118 are formed in the resulting openings above the ILD layer 102. The photobuckets 118, at this stage, represent all possible via locations in a resulting metallization layer.

Figure 1G:
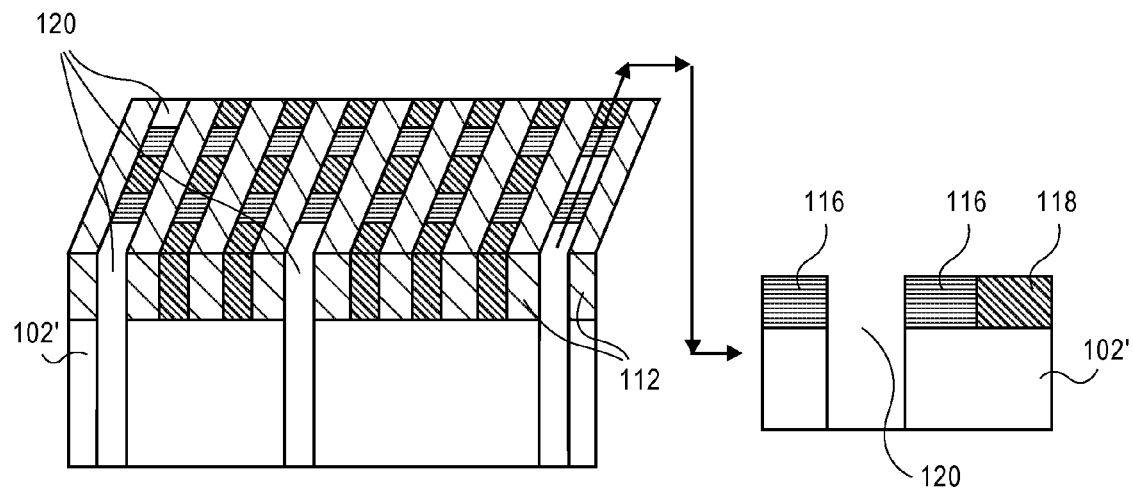

FIG. 1G illustrates the structure of FIG. 1F following photobucket exposure and development to leave selected via locations, and subsequent via opening etch into the underlying ILD, in accordance with an embodiment of the present invention. Referring to FIG. 1G select photobuckets 118 are exposed and removed to provide selected via locations 120. The via location 120 are subjected to a selective etch process, such as a selective plasma etch process, to extend the via openings into the underlying ILD layer 102, forming patterned ILD layer 102'. The etching is selective to remaining photobuckets 118, to photobuckets 116, and to the second patterned hardmask 112.

Figure 1H:
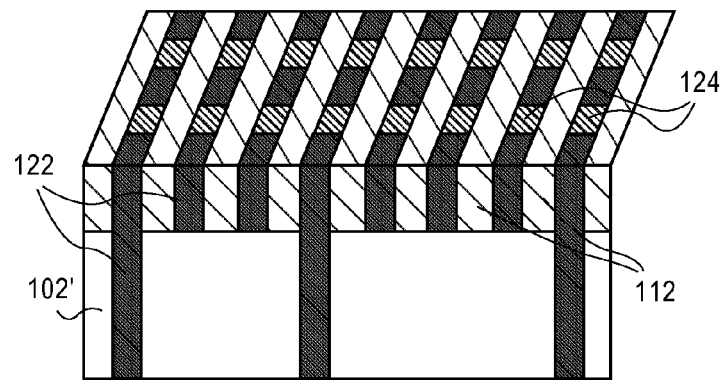

FIG. 1H illustrates the structure of FIG. 1G following removal of the remaining photobuckets, subsequent formation of a hardmask material, and subsequent formation of a second plurality of photobuckets, in accordance with an embodiment of the present invention. Referring to FIG. 1H, the remaining photobuckets are removed, e.g., by a selective etch process. All openings formed (e.g., openings formed upon removal of photobuckets 118 as well as the via locations 120) are then filled with a hardmask material 122, such as a carbon-based hardmask material. Subsequently, the photobuckets 116 is removed, e.g., with a selective etch process, and the resulting openings are filled with a second plurality of photobuckets 124. The photobuckets 124, at this stage, represent all possible plug locations in a resulting metallization layer. It is to be appreciated that the second patterned hardmask 112 is not further patterned at this stage in the process.

Figure 1I:
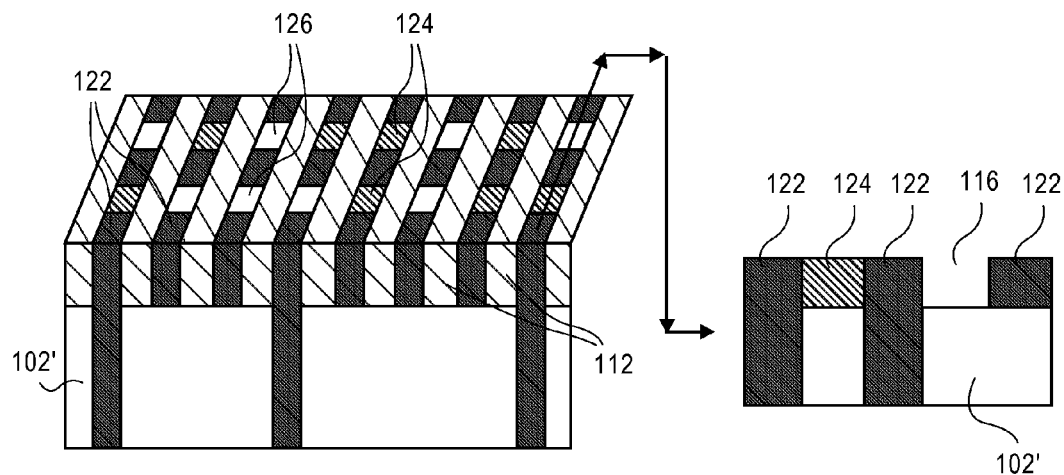

FIG. 1I illustrates the structure of FIG. 1H following plug location selection, in accordance with an embodiment of the present invention. Referring to FIG. 1I, the photobuckets 124 from FIG. 1H in are removed from locations 126 where plugs will not be formed. In locations where plugs are selected to be formed, the photobuckets 124 are retained. In one embodiment, in order to form locations 126 where plugs will not be formed, lithography is used to expose the corresponding photobuckets 124. The exposed photobuckets may then be removed by a developer.

Figure 1J:
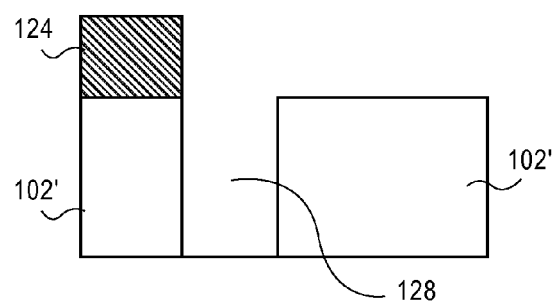

FIG. 1J illustrates the structure of FIG. 1I following removal of the most recently formed hardmask from via and line locations, in accordance with an embodiment of the present invention. Referring to FIG. 1J, the hardmask material 122 depicted in FIG. 1I is removed. In one such embodiment, the hardmask material 122 is a carbon-based hardmask material and is removed with a plasma ashing process. As shown, features remaining include, the patterned ILD layer 102', the photobuckets 124 retained for plug formation, and the via openings 128. Although not shown, it is to be appreciated that, in an embodiment, the second hardmask layer 112 is also retained at this stage.

Figure 1K:
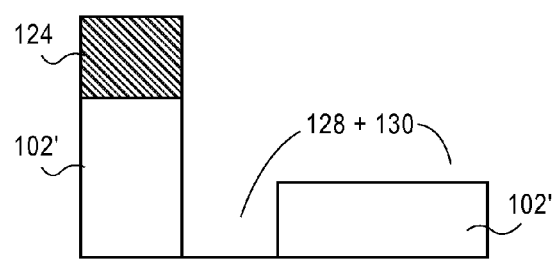

FIG. 1K illustrates the structure of FIG. 1J following recessing of the patterned ILD layer in locations not protected by plug-forming photobuckets, in accordance with an embodiment of the present invention. Referring to FIG. 1K, the portions of patterned ILD layer 102' not protected by photobuckets 124 are recessed to provide metal line openings 130, in addition to the via openings 128.

Figure 1L:
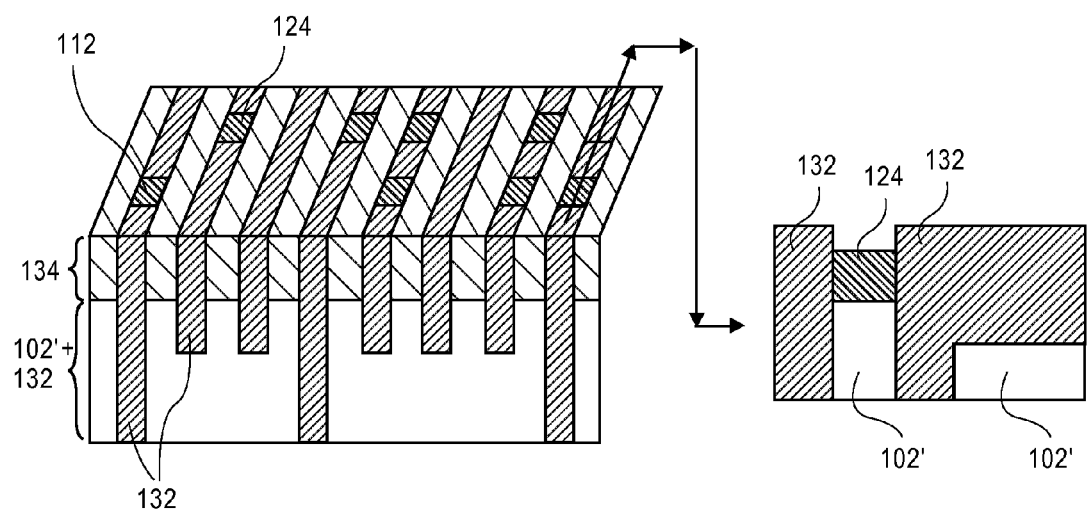

FIG. 1L illustrates the structure of FIG. 1K following metal fill, in accordance with an embodiment of the present invention. Referring to FIG. 1L, metallization 132 is formed in the openings 128 and 132. In one such embodiment, the metallization 132 is formed by a metal fill and polish back process. Referring to the left-hand portion of FIG. 1L, the structure is shown as including a lower portion including patterned ILD layer 102' having metal lines and vias (shown collectively as 132) formed therein. An upper region of the structure 134 includes the second patterned hardmask 112 as well as the remaining (plug location) photobuckets 124. In an embodiment, the upper region 134 is removed, e.g., by CMP or etch back, prior to subsequent fabrication. However, in an alternative embodiment, the upper region 134 is retained in the final structure.

The structure of FIG. 1L may subsequently be used as a foundation for forming subsequent metal line/via and ILD layers. Alternatively, the structure of FIG. 1L may represent the final metal interconnect layer in an integrated circuit. It is to be appreciated that the above process operations may be practiced in alternative sequences, not every operation need be performed and/or additional process operations may be performed. Referring again to FIG. 1L, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In a second aspect, a plugs first, vias second approach is used. As an example, FIGS. 2A-2G illustrate portions of integrated circuit layers representing various operations in a method of subtractive self-aligned plug and via patterning, in accordance with another embodiment of the present invention. In each illustration at each described operation, plan views are shown on top, and corresponding cross-sectional views are shown on the bottom. These views will be referred to herein as corresponding cross-sectional views and plan views.

Figure 2A:
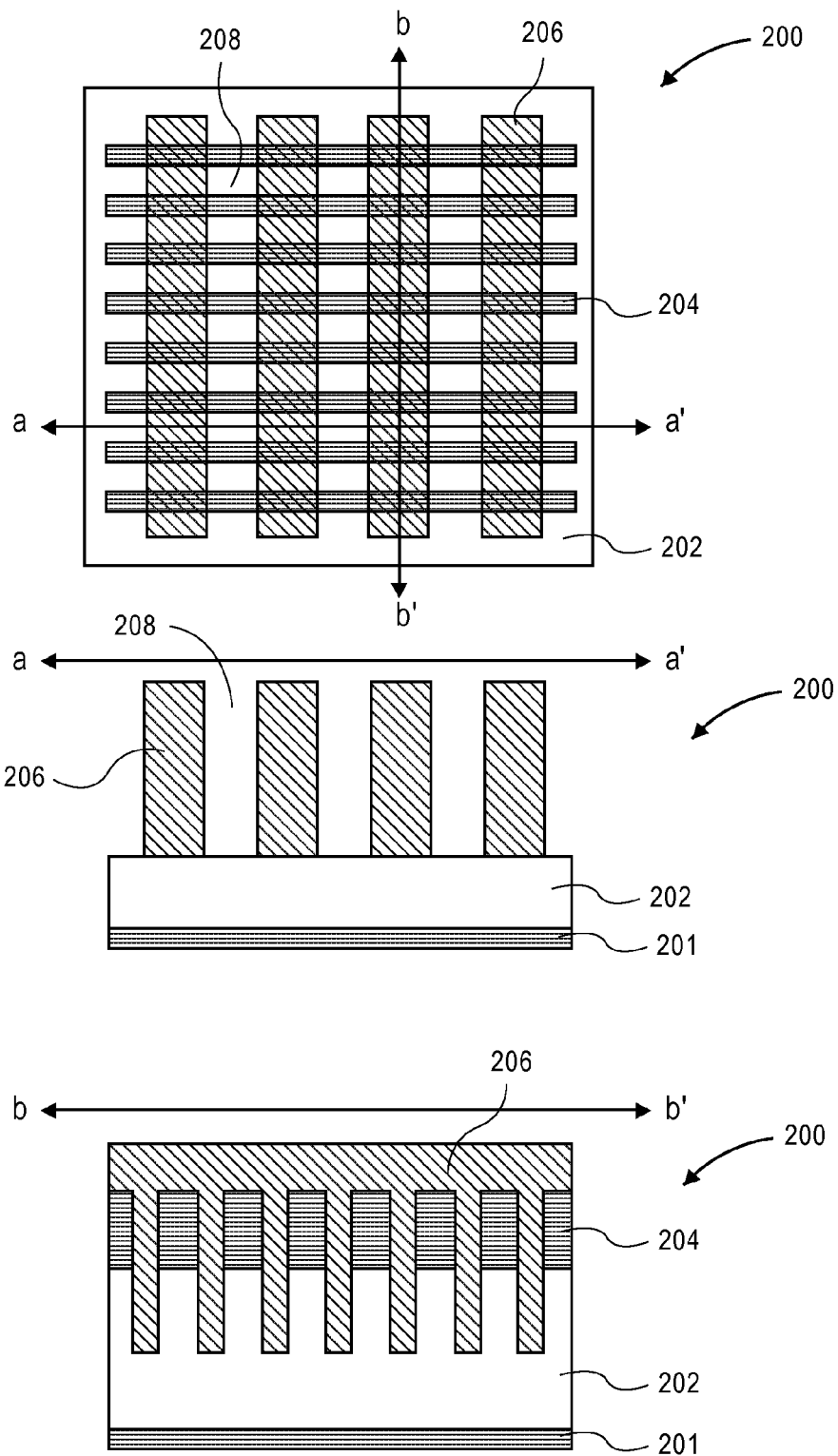
FIGS. 2A-2G illustrate portions of integrated circuit layers representing various operations in a method of subtractive self-aligned via patterning, in accordance with another embodiment of the present invention, where.

FIG. 2A illustrates a plan view and corresponding cross-sectional views of a starting orthogonal grid formed above a substrate 201, in accordance with an embodiment of the present invention. Referring to the plan view and corresponding cross-sectional views (a) and (b) taken along axes a-a' and b-b', respectively, a starting grid structure 200 includes a grating ILD layer 202 having a first hardmask layer 204 disposed thereon. A second hardmask layer 206 is disposed on the first hardmask layer 204 and is patterned to have a grating structure orthogonal to the underlying grating structure. Additionally, openings 208 remain between the grating structure of the second hardmask layer 206 and the underlying grating formed by the ILD layer 202 and the first hardmask layer 204.

Figure 2B:
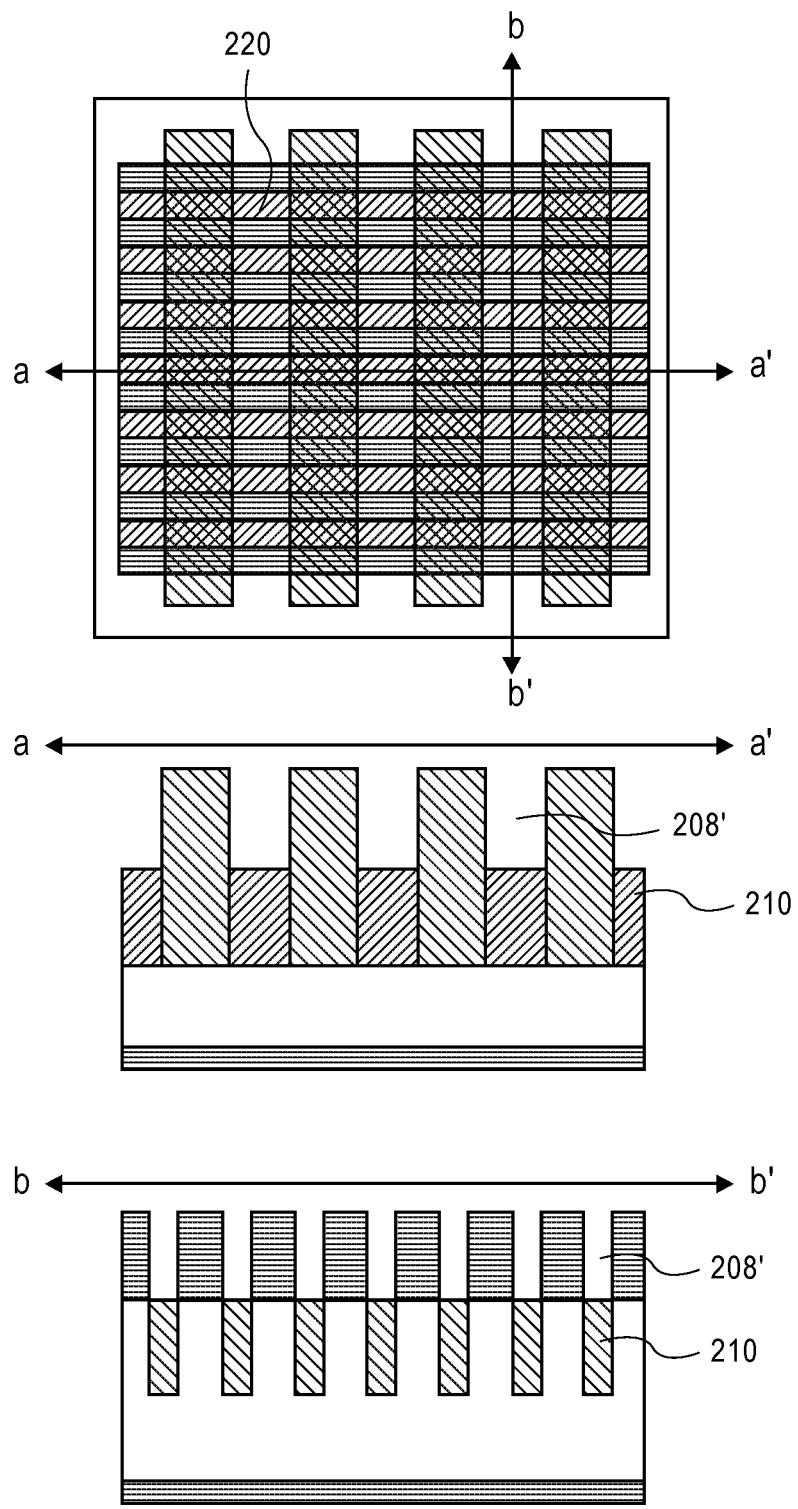

FIG. 2B illustrates a plan view and corresponding cross-sectional views of the structure of FIG. 2A following opening fill and etch back, in accordance with an embodiment of the present invention. Referring to the plan view and corresponding cross-sectional views (a) and (b) taken along axes a-a' and b-b', respectively, the openings 208 of FIG. 2A are filled with a dielectric layer 210, such as silicon oxide layer. Such a dielectric layer 210 can be formed with deposited oxide films such as by chemical vapor deposition (CVD), high density plasma deposition (HDP), or spin on dielectrics. The material as deposited may require etch back in order to achieve the relative height shown in FIG. 2B, leaving upper openings 208'.

Figure 2C:
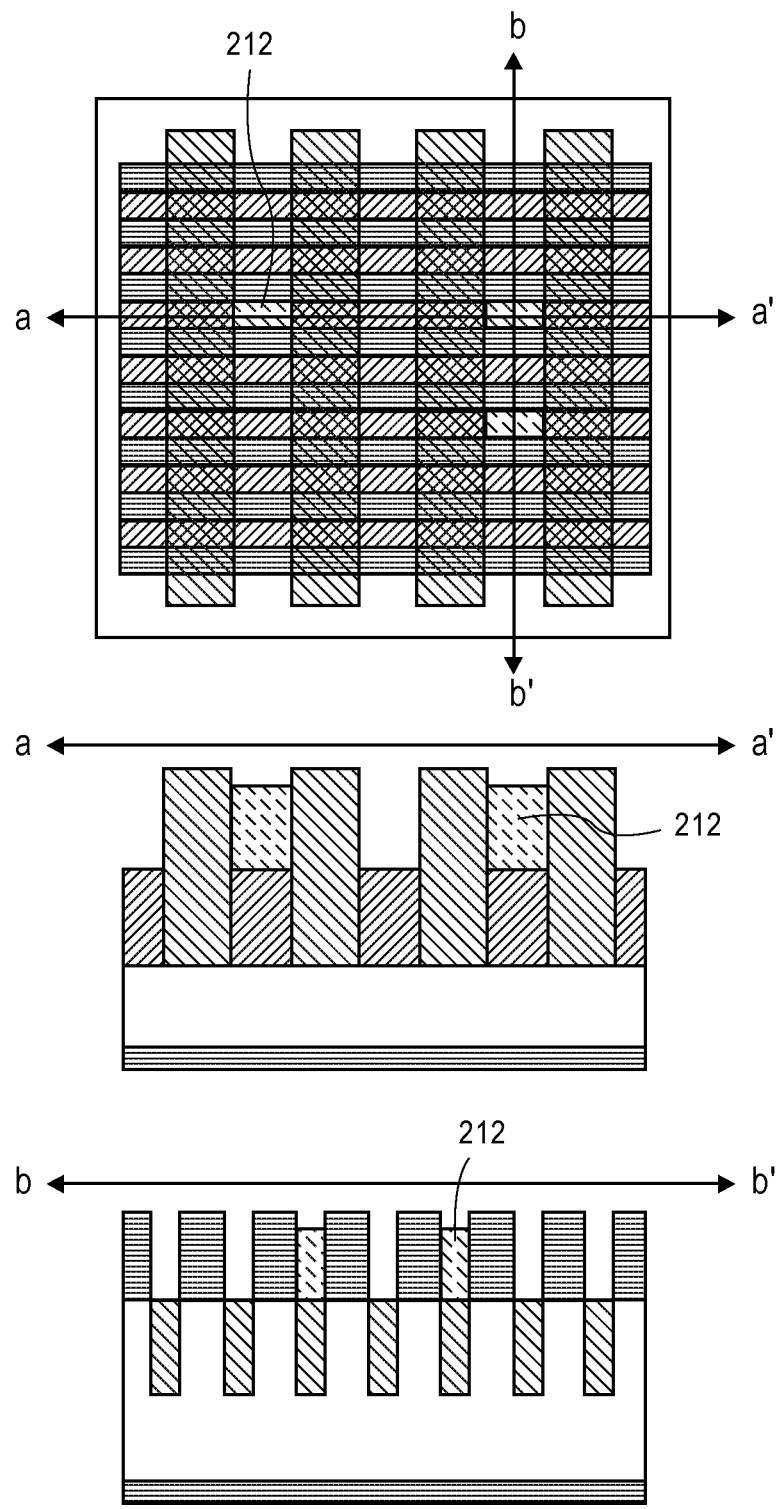

FIG. 2C illustrates a plan view and corresponding cross-sectional views of the structure of FIG. 2B following photobucket fill, exposure, and development to leave selected plug locations, in accordance with an embodiment of the present invention. Referring to the plan view and corresponding cross-sectional views (a) and (b) taken along axes a-a' and b-b', respectively, photobuckets are formed in the upper openings 208' of FIG. 2B. Subsequently, most photobuckets are exposed and removed. However, select photobuckets 212 are not exposed and thus retained to provide selected plug locations, as depicted in FIG. 2C.

Figure 2D:
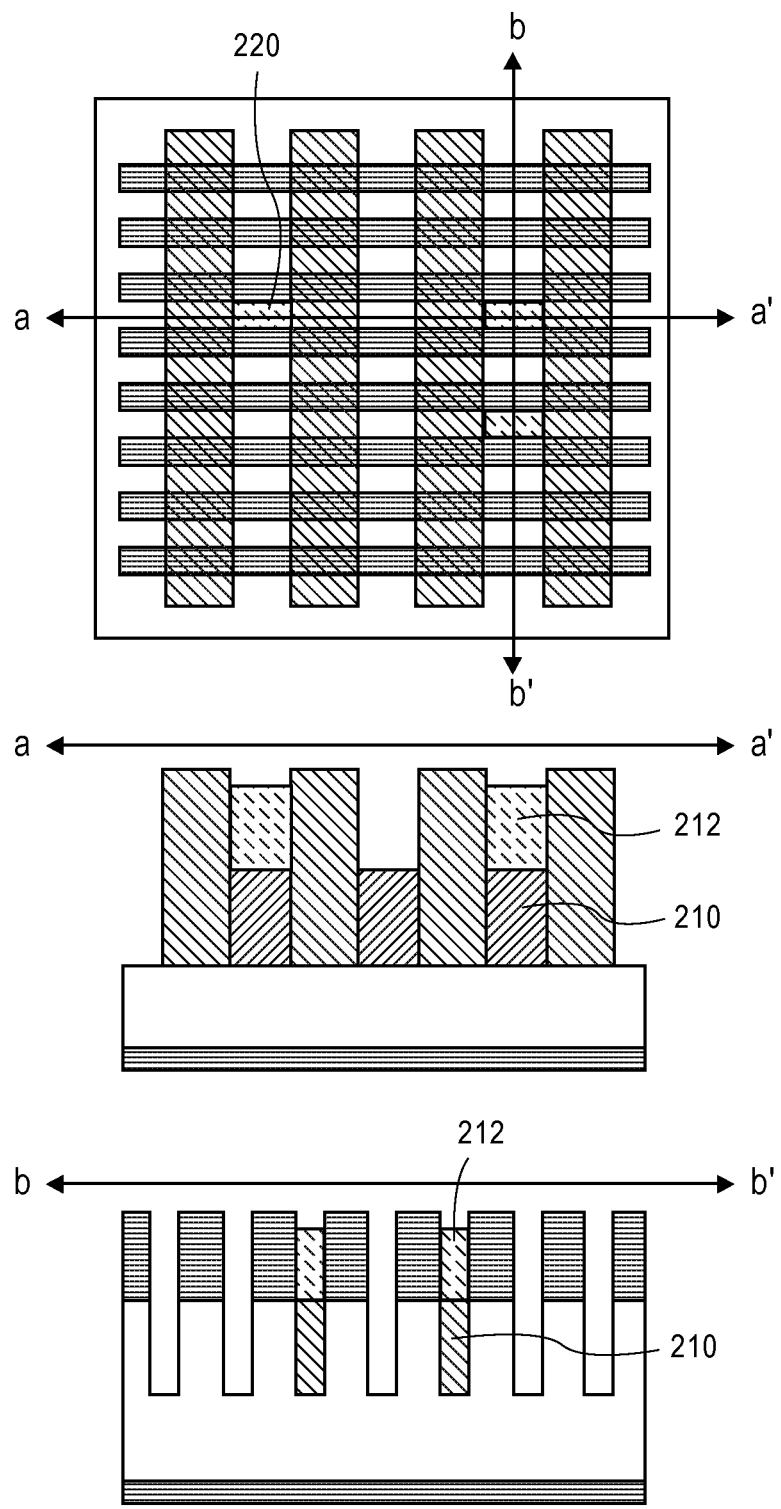

FIG. 2D illustrates a plan view and corresponding cross-sectional views of the structure of FIG. 2C following removal of portions of the dielectric layer 210, in accordance with an embodiment of the present invention. Referring to the plan view and corresponding cross-sectional views (a) and (b) taken along axes a-a' and b-b', respectively, the portions of dielectric layer 210 that are not covered by a photobucket 212 are removed. However, the portions of dielectric layer 210 that are covered by a photobucket 212 remain in the structure of FIG. 2D. In one embodiment, the portions of dielectric layer 210 that are not covered by a photobucket 212 are removed by a wet etch process.

Figure 2E:
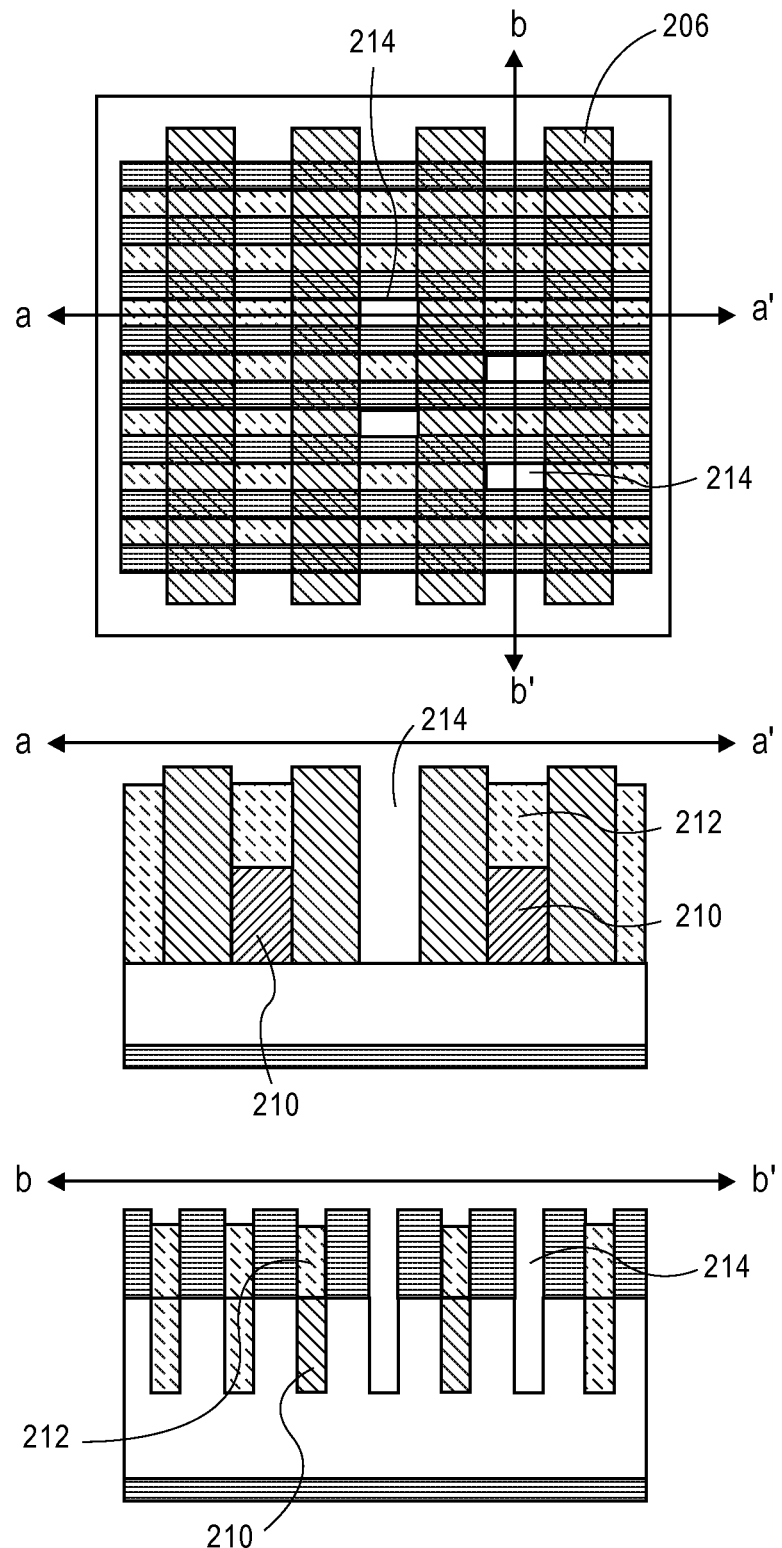

FIG. 2E illustrates a plan view and corresponding cross-sectional views of the structure of FIG. 2D following photobucket fill, exposure, and development to leave selected via locations, in accordance with an embodiment of the present invention. Referring to the plan view and corresponding cross-sectional views (a) and (b) taken along axes a-a' and b-b', respectively, photobuckets are formed in the openings formed upon removal of portions of the dielectric layer 210. Subsequently, select photobuckets are exposed and removed to provide selected via locations 214, as depicted in FIG. 2C.

Figure 2F:
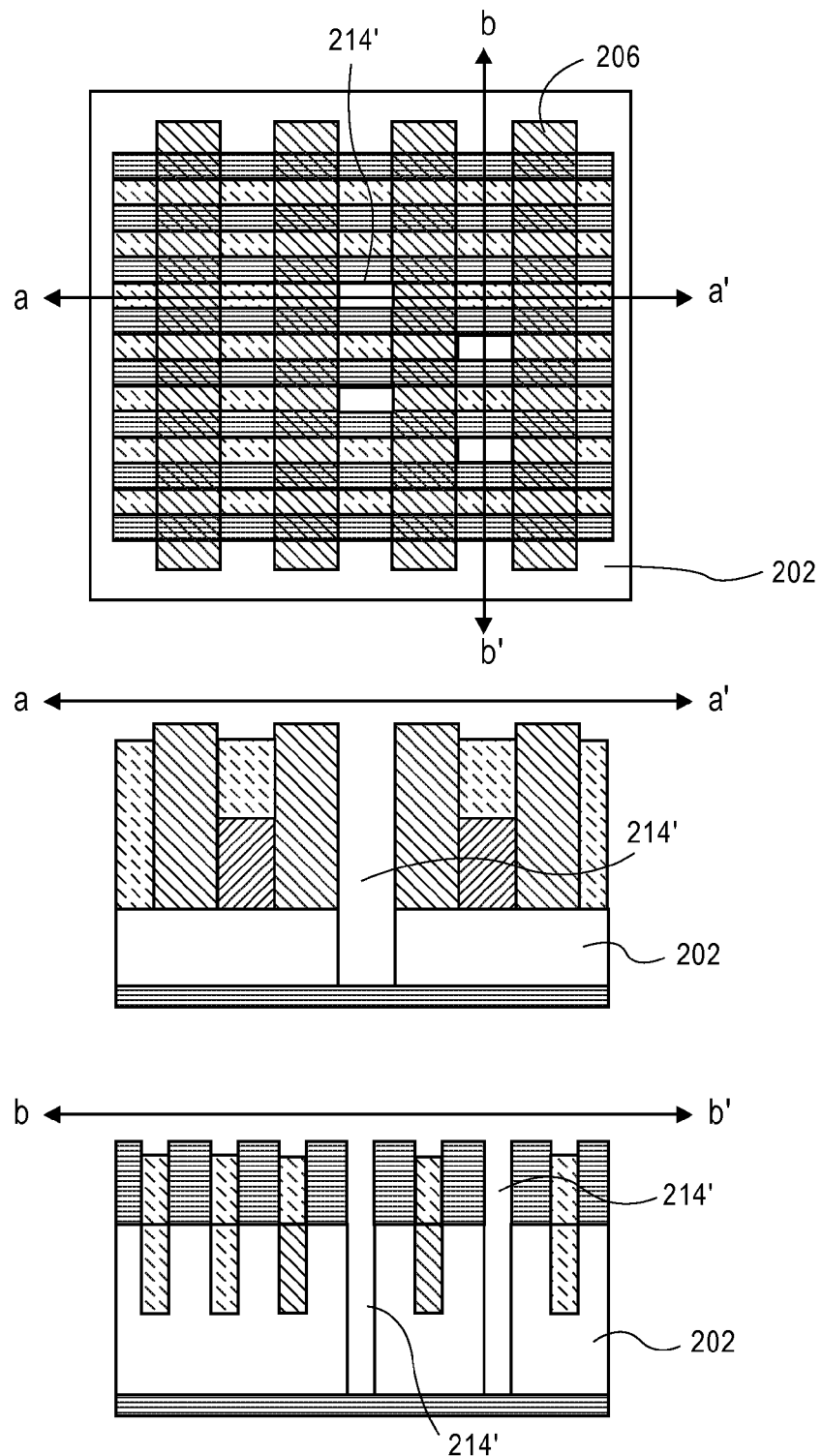

FIG. 2F illustrates a plan view and corresponding cross-sectional views of the structure of FIG. 2E following via opening etch into the underlying ILD, in accordance with an embodiment of the present invention. Referring to the plan view and corresponding cross-sectional views (a) and (b) taken along axes a-a' and b-b', respectively, the via location 214 of FIG. 2E are subjected to a selective etch process, such as a selective plasma etch process, to extend the via openings 214 to opening 214' which are formed into the underlying ILD layer 202.

Figure 2G:
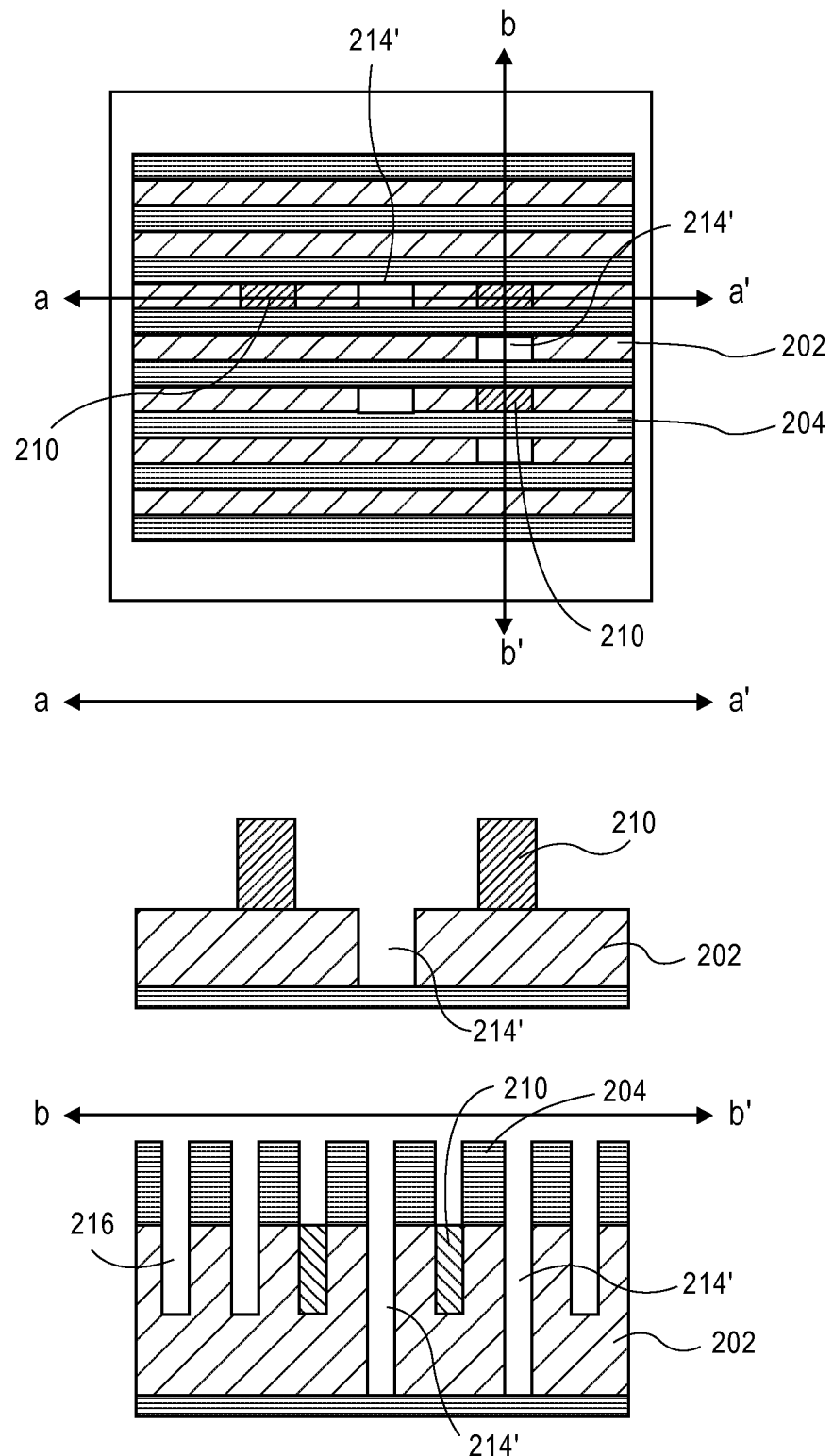

FIG. 2G illustrates a plan view and corresponding cross-sectional views of the structure of FIG. 2F following removal of the second hardmask layer and the remaining photobucket material, in accordance with an embodiment of the present invention. Referring to the plan view and corresponding cross-sectional views (a) and (b) taken along axes a-a' and b-b', respectively, the second hardmask layer 206 as well as any remaining photobucket material (i.e., photobucket material that was not already exposed and developed) is removed. The removal may be performed selective to all other remaining features. In one such embodiment, the second hardmask layer 206 is a carbon based hardmask material, and the removal is performed by an $O_2$ plasma ash process. Referring again to FIG. 2G, remaining at this stage is the ILD layer 202 having via openings 214' formed therein, and the portions of the dielectric layer 210 that were preserved for the plug locations (e.g., preserved by the overlying photobucket material). Thus, in one embodiment, the structure of FIG. 2G includes an ILD layer 202 patterned with via openings (for subsequent metal fill) with locations of dielectric layer 210 to create plugs. The remaining openings 216 can be filled with metal to form metal lines. It is to be appreciated that the hardmask 204 may be removed.

Accordingly, once filled with metal interconnect material, the structure of FIG. 2G may subsequently be used as a foundation for forming subsequent metal line/via and ILD layers. Alternatively, once filled with metal interconnect material, the structure of FIG. 2G may represent the final metal interconnect layer in an integrated circuit. It is to be appreciated that the above process operations may be practiced in alternative sequences, not every operation need be performed and/or additional process operations may be performed. Referring again to FIG. 2G, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

It is to be appreciated that the approaches described in association with FIGS. 1A-1L and 2A-2G are not necessarily performed as forming vias aligned to an underlying metallization layer. As such, in some contexts, these process schemes could be viewed as involving blind shooting in the top down direction with respect to any underlying metallization layers. In a third aspect, a subtractive approach provides alignment with an underlying metallization layer. As an example, FIGS. 3A-3I illustrate portions of integrated circuit layers representing various operations in a method of subtractive self-aligned via patterning, in accordance with another embodiment of the present invention. In each illustration at each described operation, an angled three-dimensional cross-section view is provided.

Figure 3A:
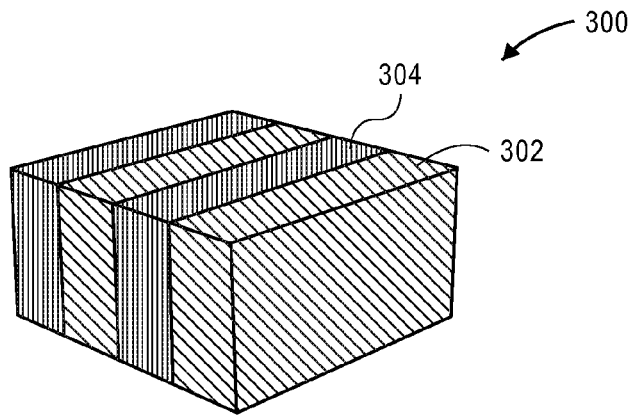
FIGS. 3A-3I illustrate portions of integrated circuit layers representing various operations in a method of subtractive self-aligned via and plug patterning, in accordance with another embodiment of the present invention, where.

FIG. 3A illustrates a starting point structure 300 for a subtractive via and plug process following deep metal line fabrication, in accordance with an embodiment of the present invention. Referring to FIG. 3A, structure 300 includes metal lines 302 with intervening interlayer dielectric (ILD) lines 304. It is to be appreciated that some of the lines 302 may be associated with underlying vias for coupling to a previous interconnect layer. In an embodiment, the metal lines 302 are formed by patterning trenches into an ILD material (e.g., the ILD material of lines 304). The trenches are then filled by metal and, if needed, planarized to the top of the ILD lines 304. In an embodiment, the metal trench and fill process involves high aspect ratio features. For example, in one embodiment, the aspect ratio of metal line height (h) to metal line width (w) is approximately in the range of 5-10.

Figure 3B:
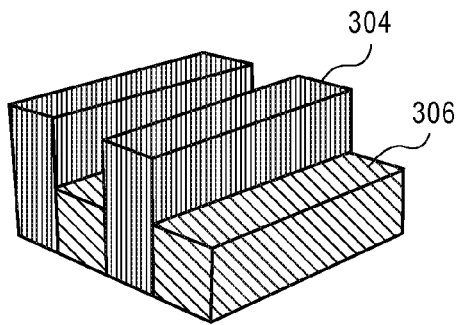

FIG. 3B illustrates the structure of FIG. 3A following recessing of the metal lines, in accordance with an embodiment of the present invention. Referring to FIG. 3B, the metal lines 302 are recessed selectively to provide first level metal lines 306. The recessing is performed selectively to the ILD lines 304. The recessing may be performed by etching through dry etch, wet etch, or a combination thereof. The extent of recessing may be determined by the targeted thickness of the first level metal lines 306 for use as suitable conductive interconnect lines within a back end of line (BEOL) interconnect structure.

Figure 3C:
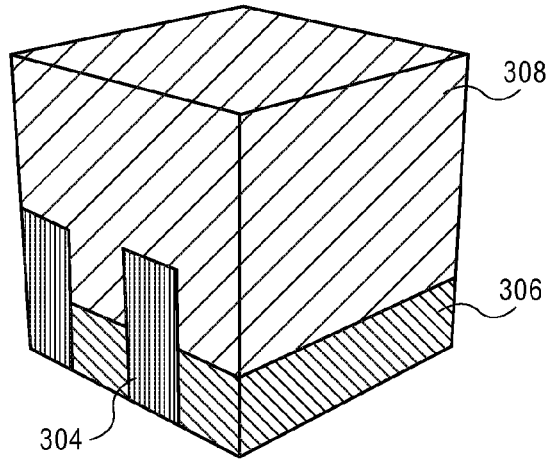

FIG. 3C illustrates the structure of FIG. 3B following formation of an inter layer dielectric (ILD) layer, in accordance with an embodiment of the present invention. Referring to FIG. 3C, an ILD material layer 308 is deposited and, if necessary, planarized, to a level above the recessed metal lines 306 and the ILD lines 304.

Figure 3D:
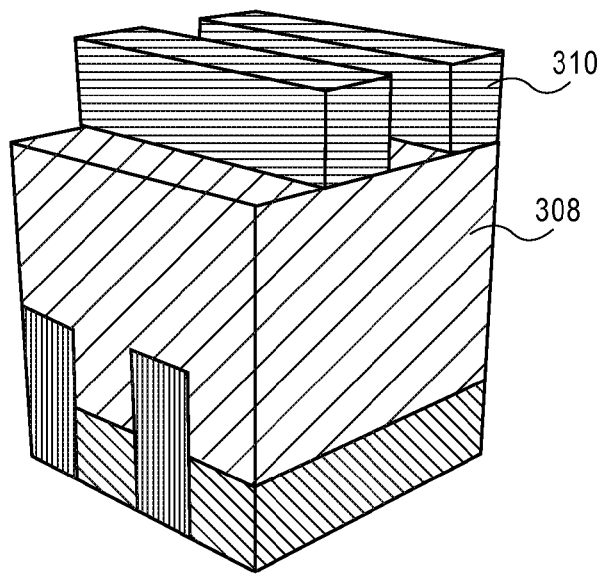

FIG. 3D illustrates the structure of FIG. 3C following deposition and patterning of a hardmask layer, in accordance with an embodiment of the present invention. Referring to FIG. 3D a hardmask layer 310 is formed on the ILD layer 308. In one such embodiment, the hardmask layer 310 is formed with a grating pattern orthogonal to the grating pattern of the first level metal lines 306/ILD lines 304, as is depicted in FIG. 3D. In an embodiment, the grating structure formed by the hardmask layer 310 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 310 of FIG. 3D may have hardmask lines spaced at a constant pitch and having a constant width.

Figure 3E:
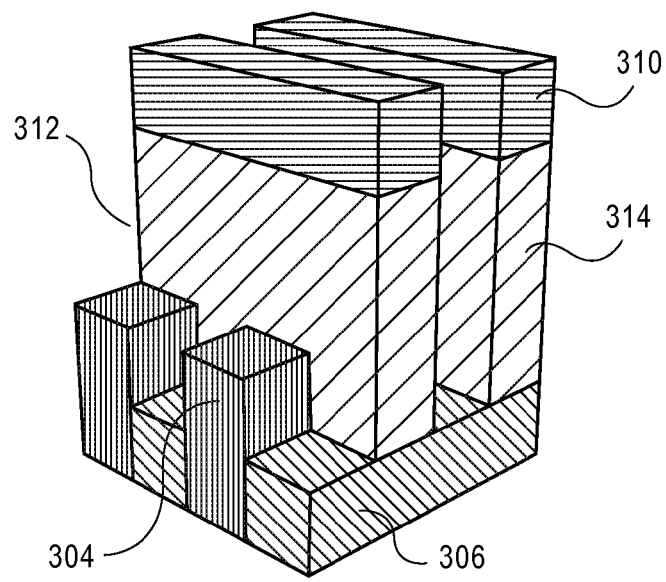

FIG. 3E illustrates the structure of FIG. 3D following trench formation defined using the pattern of the hardmask of FIG. 3D, in accordance with an embodiment of the present invention. Referring to FIG. 3E, the exposed regions (i.e., unprotected by 310) of the ILD layer 308 are etched to form trenches 312 and patterned ILD layer 314. The etch stops on, and thus exposes, the top surfaces of the first level metal lines 306 and the ILD lines 304.

Figure 3F:
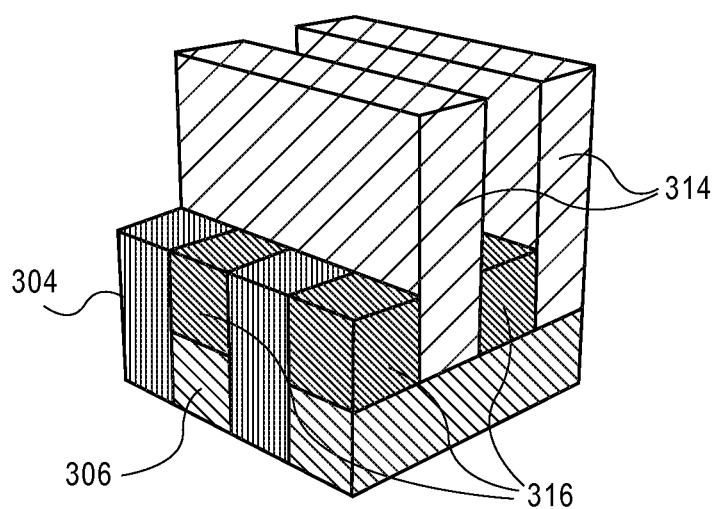

FIG. 3F illustrates the structure of FIG. 3E following photobucket formation in all possible via locations, in accordance with an embodiment of the present invention. Referring to FIG. 3F, photobuckets 316 are formed in all possible via locations above exposed portions of the recessed metal lines 306. In one embodiment, the photobuckets 316 are formed essentially co-planar with the top surfaces of the ILD lines 304, as depicted in FIG. 3F. Additionally, referring again to FIG. 3F, the hardmask layer 310 may be removed from the patterned ILD layer 314.

Figure 3G:
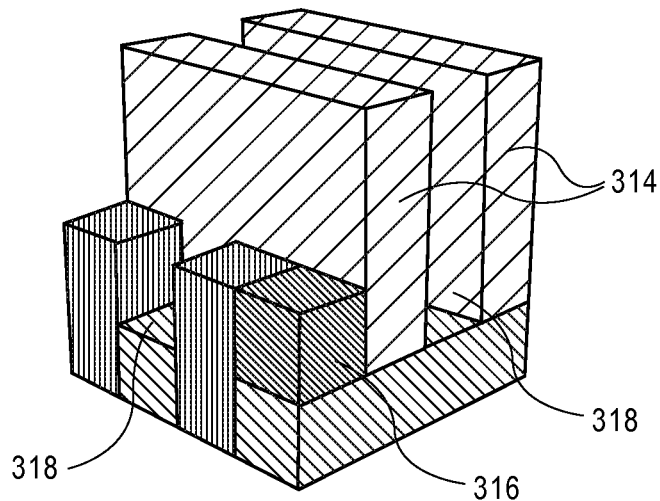

FIG. 3G illustrates the structure of FIG. 3F following via location selection, in accordance with an embodiment of the present invention. Referring to FIG. 3G, the photobuckets 316 from FIG. 3F in select via locations 318 are removed. In locations where vias are not selected to be formed, the photobuckets 316 are retained. In one embodiment, in order to form via locations 318, lithography is used to expose the corresponding photobuckets 316. The exposed photobuckets may then be removed by a developer.

Figure 3H:
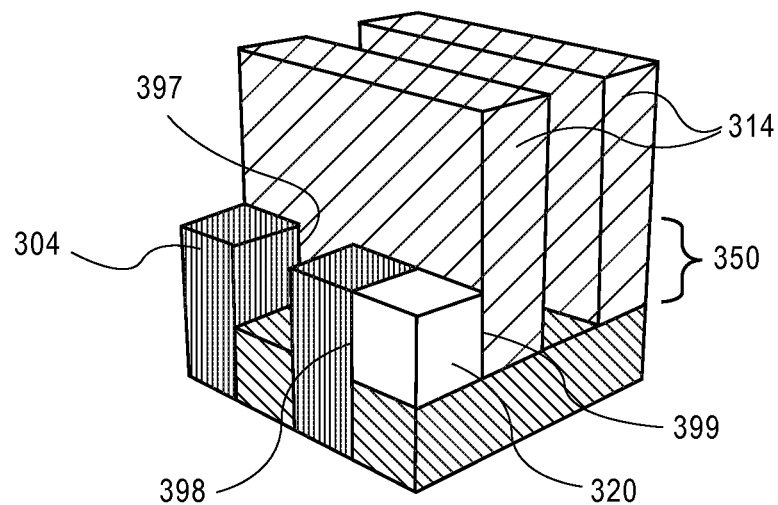

FIG. 3H illustrates the structure of FIG. 3G following conversion of the remaining photobuckets to permanent ILD material, in accordance with an embodiment of the present invention. Referring to FIG. 3H, the material of the photobuckets 316 is modified, e.g., by cross-linking upon a baking operation, in the locations to form a final ILD material 320. In one such embodiment, the cross-linking provides for a solubility switch upon the baking. The final, cross-linked material has inter-dielectric properties and, thus, can be retained in a final metallization structure. Referring again to FIG. 3H, in an embodiment, the resulting structure includes up to three different dielectric material regions (ILD lines 304+ILD lines 314+cross-linked photobucket 320) in a single plane 350 of the metallization structure. In one such embodiment, two or all of ILD lines 304, ILD lines 314, and cross-linked photobucket 320 are composed of a same material. In another such embodiment, ILD lines 304, ILD lines 314, and cross-linked photobucket 320 are all composed of different ILD materials. In either case, in a specific embodiment, a distinction such as a vertical seam between the materials of ILD lines 304 and ILD lines 314 (e.g., seam 397) and/or between ILD lines 304 and cross-linked photobucket 320 (e.g., seam 398) and/or between ILD lines 314 and cross-linked photobucket 320 (e.g., seam 399) may be observed in the final structure.

Figure 3I:
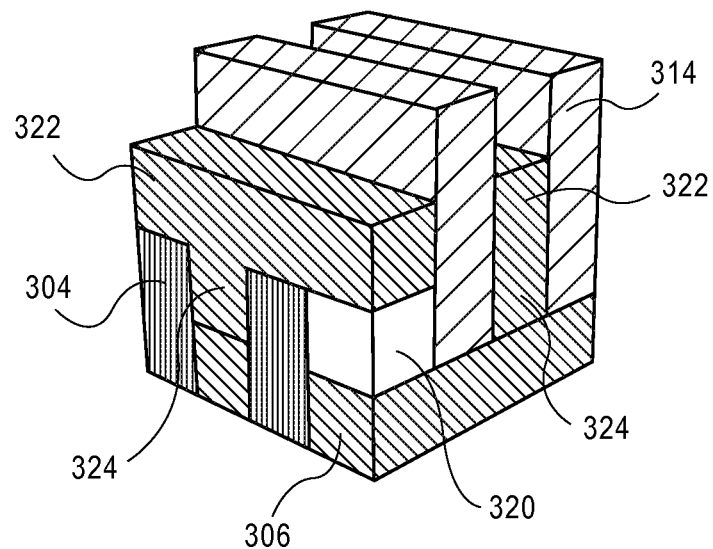

FIG. 3I illustrates the structure of FIG. 3H following metal line and via formation, in accordance with an embodiment of the present invention. Referring to FIG. 3I, metal lines 322 and vias 324 are formed upon metal fill of the openings of FIG. 3H. The metal lines 322 are coupled to the underlying metal lines 306 by the vias 324. In an embodiment, the openings are filled in a damascene approach or a bottom-up fill approach to provide the structure shown in FIG. 3I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 314 may be removed to provide air gaps between the resulting metal lines 324.

The structure of FIG. 3I may subsequently be used as a foundation for forming subsequent metal line/via and ILD layers. Alternatively, the structure of FIG. 3I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 3I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of photobucket interlayer dielectric (ILD) to select locations for plugs and vias. The photobucket ILD composition is typically very different from standard ILD and, in one embodiment, is perfectly self-aligned in both directions. More generally, in an embodiment, the term "photobucket" as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be understood that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. Furthermore, in an embodiment, instead of exposing at, e.g. 30 mJ/cm2, such photobuckets might be exposed at, e.g., 3 mJ/cm2. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes. In one embodiment, the photobuckets are subject to exposure of extreme ultraviolet (EUV) light in order to expose the photobuckets, where in a particular embodiment, EUV exposure is in the range of 5-15 nanometers.

In an embodiment, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers may be formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
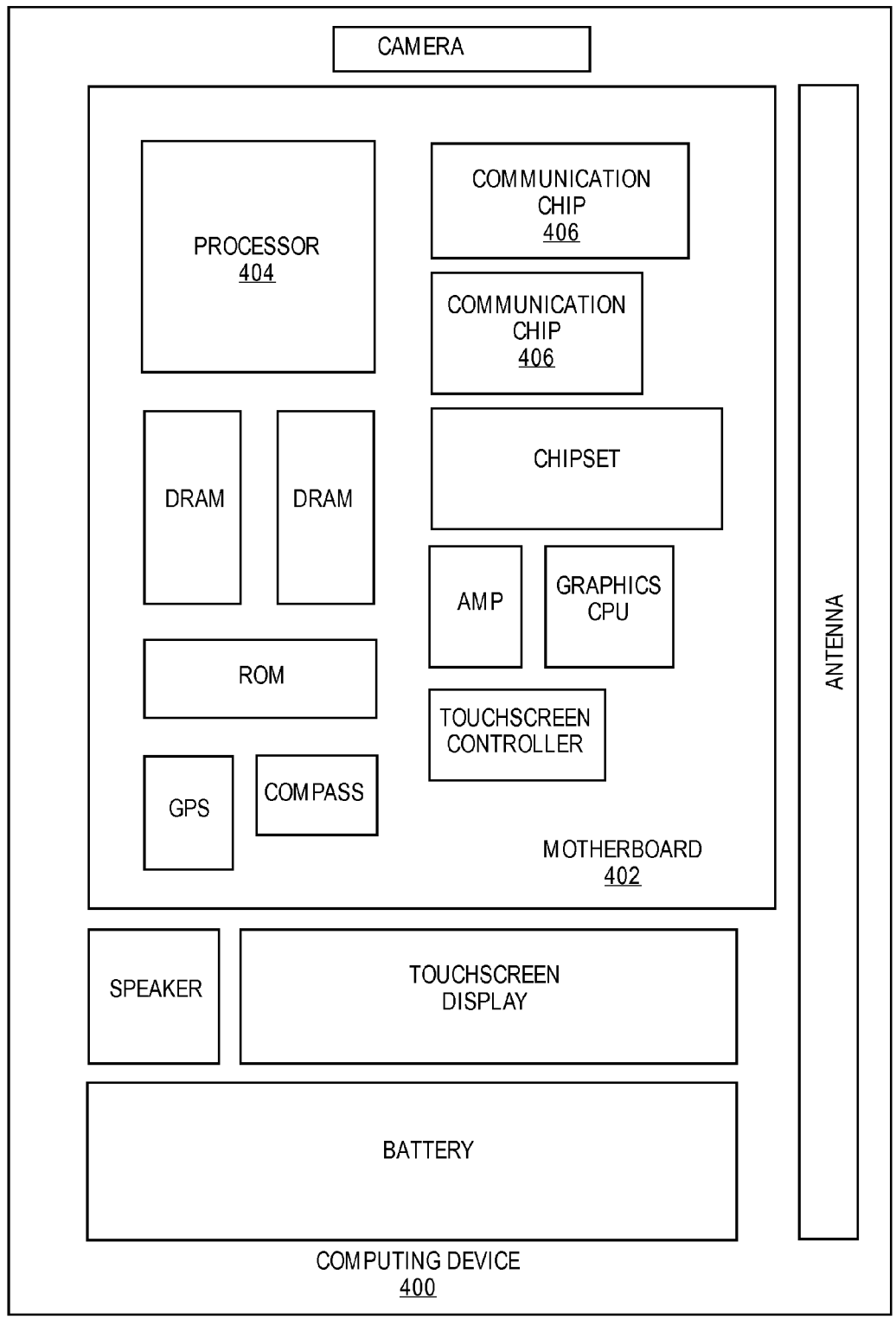
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more structures, such as self-aligned vias and plugs, built in accordance with implementations of the invention.

In further implementations, another component housed within the computing device 400 may contain an integrated circuit die that includes one or more structures, such as self-aligned vias and plugs, built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, embodiments of the present invention include self-aligned via and plug patterning with photobuckets for back end of line (BEOL) interconnects.

In an embodiment, an interconnect structure for an integrated circuit includes a first layer of the interconnect structure disposed above a substrate, the first layer having a first grating of alternating metal lines and dielectric lines in a first direction. The dielectric lines have an uppermost surface higher than an uppermost surface of the metal lines. The integrated circuit also includes a second layer of the interconnect structure disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. The integrated circuit also includes a region of dielectric material disposed between the metal lines of the first grating and the metal lines of the second grating, and in a same plane as upper portions of the dielectric lines of the first grating and lower portions of the dielectric lines of the second grating. The region of dielectric material is composed of a cross-linked photolyzable material.

In one embodiment, the interconnect structure further includes a conductive via disposed between and coupling a metal line of the first grating to a metal line of the second grating, the conductive via directly adjacent to and in the same plane as the region of dielectric material.

In one embodiment, the conductive via has a center directly aligned with a center of the metal line of the first grating and with a center of the metal line of the second grating.

In one embodiment, the dielectric lines of the first grating are composed of a first dielectric material, and the dielectric lines of the second grating are composed of a second, different dielectric material. The first and second dielectric materials are different than the cross-linked photolyzable material.

In one embodiment, the dielectric lines of the first grating and the dielectric lines of the second grating are composed of a same dielectric material different than the cross-linked photolyzable material.

In an embodiment, a method of fabricating an interconnect structure for an integrated circuit involves providing a metallization structure comprising an alternating metal line and dielectric line first grating having a first direction, each dielectric line of the first grating having a top surface essentially co-planar with a top surface of each metal line. The method also involves recessing the metal lines of the first grating below the top surface of the dielectric lines of the first grating and to form recessed metal lines of the first grating. The method also involves forming an inter layer dielectric (ILD) layer above the dielectric lines and the recessed metal lines of the first grating, the ILD layer having a second grating in a second direction, perpendicular to the first direction, revealing portions of the recessed metal lines. The method also involves forming a plurality of photobuckets in all possible via locations above the recessed metal lines. The method also involves exposing, developing and removing fewer than all of the plurality of photobuckets to form one or more via openings. The method also involves, subsequently, baking all remaining photobuckets. The method also involves forming metal lines above, and vias in a same plane as, the baked photobuckets.

In one embodiment, forming the ILD layer comprises involves forming an unpatterned layer of the ILD layer material, forming a hardmask layer above the ILD layer, the hardmask layer having a pattern of the second grating, and etching the unpatterned layer of the ILD layer material to for the ILD layer.

In one embodiment, forming the plurality of photobuckets involves forming a layer of photolyzable material, and baking the remaining photobuckets involves cross-linking the remaining photobuckets.

In one embodiment, baking the remaining photobuckets involves forming a permanent ILD material.

In one embodiment, the dielectric lines of the first grating are composed of a first dielectric material, and the ILD layer is composed of a second, different dielectric material.

In one embodiment, the dielectric lines of the first grating and the ILD layer are composed of a same dielectric material.

In one embodiment, exposing, developing and removing fewer than all of the plurality of photobuckets involves exposing the fewer than all of the plurality of photobuckets to extreme ultra-violet (EUV) irradiation.

In an embodiment, a method of fabricating an interconnect structure for an integrated circuit involves forming a first hardmask layer above an ILD material layer, the first hardmask layer and an upper portion of the ILD material layer having a first grating in a first direction. The method also involves forming a second hardmask layer above the ILD material layer and above the first hardmask layer, the second hardmask layer having a second grating in a second direction, perpendicular to the first direction. The method also involves forming a dielectric material in openings formed by the grating patterns of the first and second hardmask layers. The method also involves forming a first plurality of photobuckets on the dielectric material. The method also involves exposing, developing and removing fewer than all of the first plurality of photobuckets to form one or more corresponding non-plug locations, wherein the remaining photobuckets define plug locations. The method also involves removing the portions of the dielectric material not protected by the remaining photobuckets. The method also involves forming a second plurality of photobuckets in all possible via regions. The method also involves exposing, developing and removing fewer than all of the second plurality of photobuckets to form one or more via openings. The method also involves etching the ILD material layer through one or more via openings to form corresponding via locations. The method also involves removing all remaining of the first and second pluralities of photobuckets. The method also involves removing the second hardmask layer. The method also involves forming metal vias in corresponding of the one or more via locations and metal lines above the metal vias.

In one embodiment, forming the second hardmask layer involves forming a carbon-based hardmask layer, and removing the second hardmask layer involves using an ashing process.

In one embodiment, the method further involves removing the first hardmask layer.

In one embodiment, exposing, developing and removing fewer than all of the first plurality of photobuckets and fewer than all of the second plurality of photobuckets involves exposing to extreme ultra-violet (EUV) irradiation.

In an embodiment, a method of fabricating an interconnect structure for an integrated circuit involves forming a first hardmask layer above an ILD material layer, the first hardmask layer having a first grating in a first direction. The method also involves forming a second hardmask layer above the ILD material layer and interleaved with the first hardmask layer. The method also involves forming a hardmask cap layer above the first and second hardmask layers, the hardmask cap layer having a second grating in a second direction, perpendicular to the first direction. The method also involves patterning the first hardmask layer using the hardmask cap layer as a mask to form all possible via regions above the ILD material layer. The method also involves forming a first plurality of photobuckets in the all possible via regions. The method also involves exposing, developing and removing fewer than all of the first plurality of photobuckets to form one or more via openings. The method also involves etching the ILD material layer through one or more via openings to form corresponding via locations. The method also involves removing all remaining of the first plurality of photobuckets. The method also involves, subsequently, forming a third hardmask layer in the via locations and the remaining of the all possible via regions. The method also involves removing all remaining portions of the first hardmask layer to form all possible plug regions above the ILD material layer. The method also involves forming a second plurality of photobuckets in the all possible plug regions. The method also involves exposing, developing and removing fewer than all of the second plurality of photobuckets to form one or more corresponding non-plug locations, wherein the remaining of the second plurality of photobuckets define plug locations. The method also involves recessing the portions of the ILD material layer not protected by the remaining of the second plurality of photobuckets. The method also involves removing the third hardmask and all remaining of the second plurality of photobuckets. The method also involves forming metal vias in corresponding of the one or more via locations and metal lines above the metal vias.

In one embodiment, the method further involves, prior to forming the first plurality of photobuckets in the all possible via regions, removing the hardmask cap layer.

In one embodiment, forming the third hardmask layer involves forming a carbon-based hardmask layer, and removing the third hardmask layer involves using an ashing process.

In one embodiment, exposing, developing and removing fewer than all of the first plurality of photobuckets and fewer than all of the second plurality of photobuckets involves exposing to extreme ultra-violet (EUV) irradiation.

What is claimed is:

1. An interconnect structure for an integrated circuit, the interconnect structure comprising:
    a first layer of the interconnect structure disposed above a substrate, the first layer comprising a first grating of alternating metal lines and dielectric lines in a first direction, wherein the dielectric lines have an uppermost surface higher than an uppermost surface of the alternating metal lines; and
    a second layer of the interconnect structure disposed above the first layer of the interconnect structure, the second layer of the interconnect structure comprising a second grating of alternating metal lines and dielectric lines in a second direction, perpendicular to the first direction, wherein the dielectric lines have a lowermost surface lower than a lowermost surface of the alternating metal lines of the second grating, wherein the dielectric lines of the second grating overlap and contact, but are distinct from, the dielectric lines of the first grating; and
    a region of dielectric material disposed between the alternating metal lines of the first grating and the alternating metal lines of the second grating, and in a same plane as upper portions of the dielectric lines of the first grating and lower portions of the dielectric lines of the second grating, the region of dielectric material comprising a cross-linked photolyzable material.

2. The interconnect structure of claim 1, further comprising:
    a conductive via disposed between and coupling a metal line of the first grating to a metal line of the second grating, the conductive via in the same plane as the region of dielectric material.

3. The interconnect structure of claim 2, wherein the conductive via has a center directly aligned with a center of the metal line of the first grating and with a center of the metal line of the second grating.

4. The interconnect structure of claim 1, wherein the dielectric lines of the first grating comprise a first dielectric material, and the dielectric lines of the second grating comprise a second, different dielectric material, and wherein the first and second dielectric materials are different than the cross-linked photolyzable material.

5. The interconnect structure of claim 1, wherein the dielectric lines of the first grating and the dielectric lines of the second grating comprise a same dielectric material different than the cross-linked photolyzable material.

6. A method of fabricating an interconnect structure for an integrated circuit, the method comprising:
    providing a metallization structure comprising an alternating metal line and dielectric line first grating having a first direction, each dielectric line of the first grating having a top surface essentially co-planar with a top surface of each metal line;
    recessing the metal lines of the first grating below the top surface of the dielectric lines of the first grating and to form recessed metal lines of the first grating;
    forming an inter layer dielectric (ILD) layer above the dielectric lines and the recessed metal lines of the first grating, the ILD layer having a second grating in a second direction, perpendicular to the first direction, revealing portions of the recessed metal lines;
    forming a plurality of photobuckets in all possible via locations above the recessed metal lines;
    exposing, developing and removing fewer than all of the plurality of photobuckets to form one or more via openings; and, subsequently,
    baking all remaining photobuckets;
    forming metal lines above, and vias in a same plane as, the baked photobuckets.

7. The method of claim 6, wherein forming the ILD layer comprises:
    forming an unpatterned layer of the ILD layer material;
    forming a hardmask layer above the ILD layer, the hardmask layer having a pattern of the second grating; and
    etching the unpatterned layer of the ILD layer material to provide the pattern of the second grating for the ILD layer.

8. The method of claim 6, wherein forming the plurality of photobuckets comprises forming a layer of photolyzable material, and wherein baking the remaining photobuckets comprises cross-linking the remaining photobuckets.

9. The method of claim 6, wherein baking the remaining photobuckets comprises forming a permanent ILD material.

10. The method of claim 6, wherein the dielectric lines of the first grating comprise a first dielectric material, and the ILD layer comprises a second, different dielectric material.

11. The method of claim 6, wherein the dielectric lines of the first grating and the ILD layer comprise a same dielectric material.

12. The method of claim 6, wherein exposing, developing and removing fewer than all of the plurality of photobuckets comprises exposing the fewer than all of the plurality of photobuckets to extreme ultra-violet (EUV) irradiation.

13. A method of fabricating an interconnect structure for an integrated circuit, the method comprising:
    forming a first hardmask layer above an inter layer dielectric (ILD) material layer, the first hardmask layer and an upper portion of the inter layer dielectric (ILD) material layer having a first grating in a first direction;
    forming a second hardmask layer above the inter layer dielectric (ILD) material layer and above the first hardmask layer, the second hardmask layer having a second grating in a second direction, perpendicular to the first direction;
    forming a dielectric material in openings formed by the grating patterns of the first and second hardmask layers;
    forming a first plurality of photobuckets on the dielectric material in openings;
    exposing, developing and removing fewer than all of the first plurality of photobuckets to form one or more corresponding non-plug locations, wherein the remaining photobuckets define plug locations;
    removing the portions of the dielectric material not protected by the remaining photobuckets;
    forming a second plurality of photobuckets in all possible via regions;
    exposing, developing and removing fewer than all of the second plurality of photobuckets to form one or more via openings;
    etching the inter layer dielectric (ILD) material layer through one or more via openings to form corresponding via locations;
    removing all remaining of the first and second pluralities of photobuckets;
    removing the second hardmask layer; and
    forming metal vias in corresponding of the one or more via locations and metal lines above the metal vias.

14. The method of claim 13, wherein forming the second hardmask layer comprises forming a carbon-based hardmask layer, and wherein removing the second hardmask layer comprises using an ashing process.

15. The method of claim 13, further comprising:
removing the first hardmask layer.

16. The method of claim 13, wherein exposing, developing and removing fewer than all of the first plurality of photobuckets and fewer than all of the second plurality of photobuckets comprises exposing to extreme ultra-violet (EUV) irradiation.

17. A method of fabricating an interconnect structure for an integrated circuit, the method comprising:
forming a first hardmask layer above an inter layer dielectric (ILD) material layer, the first hardmask layer having a first grating in a first direction;
forming a second hardmask layer above the inter layer dielectric (ILD) material layer and interleaved with the first hardmask layer;
forming a hardmask cap layer above the first and second hardmask layers, the hardmask cap layer having a second grating in a second direction, perpendicular to the first direction;
patterning the first hardmask layer using the hardmask cap layer as a mask to form all possible via regions above the inter layer dielectric (ILD) material layer;
forming a first plurality of photobuckets in the all possible via regions;
exposing, developing and removing fewer than all of the first plurality of photobuckets to form one or more via openings;
etching the inter layer dielectric (ILD) material layer through one or more via openings to form corresponding via locations;
removing all remaining of the first plurality of photobuckets; and, subsequently, forming a third hardmask layer in the via locations and the remaining of the all possible via regions;
removing all remaining portions of the first hardmask layer to form all possible plug regions above the inter layer dielectric (ILD) material layer;
forming a second plurality of photobuckets in the all possible plug regions;
exposing, developing and removing fewer than all of the second plurality of photobuckets to form one or more corresponding non-plug locations, wherein the remaining of the second plurality of photobuckets define plug locations;
recessing the portions of the inter layer dielectric (ILD) material layer not protected by the remaining of the second plurality of photobuckets;
removing the third hardmask and all remaining of the second plurality of photobuckets; and
forming metal vias in corresponding of the one or more via locations and metal lines above the metal vias.

18. The method of claim 17, further comprising:
prior to forming the first plurality of photobuckets in the all possible via regions, removing the hardmask cap layer.

19. The method of claim 17, wherein forming the third hardmask layer comprises forming a carbon-based hardmask layer, and wherein removing the third hardmask layer comprises using an ashing process.

20. The method of claim 17, wherein exposing, developing and removing fewer than all of the first plurality of photobuckets and fewer than all of the second plurality of photobuckets comprises exposing to extreme ultra-violet (EUV) irradiation.

* * * * *